United States Patent
Hanna et al.

(10) Patent No.: US 8,826,201 B1
(45) Date of Patent: Sep. 2, 2014

(54) FORMAL VERIFICATION COVERAGE METRICS FOR CIRCUIT DESIGN PROPERTIES

(71) Applicant: Jasper Design Automation, Inc., Mountain View, CA (US)

(72) Inventors: Ziyad E. Hanna, Haifa (IL); Per Anders M. Franzén, Göteborg (SE); Ross M. Weber, Plymouth, MN (US); Habeeb A. Farah, Nazareth (IL); Rajeev K. Ranjan, Sunnyvale, CA (US)

(73) Assignee: Jasper Design Automation, Inc., Mountain View, CA (US)

( * ) Notice: Subject to any disclaimer, the term of this patent is extended or adjusted under 35 U.S.C. 154(b) by 0 days.

(21) Appl. No.: 13/826,801

(22) Filed: Mar. 14, 2013

(51) Int. Cl.
*G06F 9/455* (2006.01)
*G06F 17/50* (2006.01)

(52) U.S. Cl.
USPC ............................ 716/106; 716/104; 716/136

(58) Field of Classification Search
CPC .............. G06F 17/504; G06F 17/5022; G06F 17/5045; G06F 17/5031; G06F 9/455; G01R 31/318314
USPC .......................................... 716/104, 106, 136
See application file for complete search history.

(56) References Cited

U.S. PATENT DOCUMENTS

| | | | |
|---|---|---|---|
| 6,975,976 B1 * | 12/2005 | Casavant et al. | 703/14 |
| 7,249,332 B1 * | 7/2007 | Agmon | 716/106 |
| 7,454,324 B1 * | 11/2008 | Seawright et al. | 703/14 |
| 7,458,046 B2 * | 11/2008 | Ghosh et al. | 716/106 |
| 7,895,552 B1 * | 2/2011 | Singhal et al. | 716/106 |
| 8,572,527 B1 * | 10/2013 | Coelho et al. | 716/102 |
| 2003/0110474 A1 * | 6/2003 | Ur et al. | 717/131 |
| 2003/0115564 A1 * | 6/2003 | Chang et al. | 716/8 |
| 2006/0010428 A1 * | 1/2006 | Rushby et al. | 717/124 |
| 2007/0022394 A1 * | 1/2007 | Ghosh et al. | 716/5 |
| 2007/0180414 A1 * | 8/2007 | Harer et al. | 716/5 |
| 2008/0066032 A1 * | 3/2008 | Levitt et al. | 716/5 |
| 2008/0276144 A1 * | 11/2008 | Huben et al. | 714/733 |
| 2012/0203535 A1 * | 8/2012 | Arbel et al. | 703/22 |
| 2013/0019216 A1 * | 1/2013 | Vasudevan et al. | 716/106 |
| 2013/0060545 A1 * | 3/2013 | Chockler et al. | 703/6 |

OTHER PUBLICATIONS

Bailey, B. et al., "Combining Metrics from Simulation and Formal," *Jasper Design Automation*, Aug. 5, 2008, two pages, Tech Pro Communications. [Online] [Retrieved Jan. 7, 2014] Retrieved from the Internet <URL: http://www.soccentral.com/results.asp?entryID=26340#PrintPage.>.

(Continued)

*Primary Examiner* — Nha Nguyen
*Assistant Examiner* — Brian Ngo
(74) *Attorney, Agent, or Firm* — Vista IP Law Group, LLP

(57) ABSTRACT

A computer-implemented method and non-transitory computer readable medium for circuit design verification. Formal verification is performed on a circuit design to prove a correctness of a property of the circuit design. The circuit design has a cone of influence representing a portion of the circuit design capable of affecting signals of the property. A proof core of the circuit design is identified, the proof core being a portion of the cone of influence that is sufficient to prove the correctness of the property. A coverage metric is generated that is indicative of a level of formal verification coverage provided by the property based on the proof core of the circuit design.

18 Claims, 4 Drawing Sheets

(56) References Cited

OTHER PUBLICATIONS

Chockler, H. et al., "Coverage Metrics for Formal Verification," *Correct Hardware Design and Verification Methods, Proceedings of the 12th IFIP WG 10.5 Advanced Research Working Conference, CHARME 2003*, Oct. 21-24, 2003, pp. 111-125, L'Aquila, Italy.

Chockler, H. et al., "Coverage Metrics for Temporal Logic Model Checking," *Tools and Algorithms for the Construction and Analysis of Systems, Proceedings of the 7th International Conference, TACAS 2001*, Apr. 2-6, 2001, pp. 528-542, vol. 2031, Genova, Italy.

Claessen, K., "A Coverage Analysis for Safety Property Lists," *Proceedings of Seventh International Conference on Formal Methods in Computer-Aided Design, FMCAD 2007*, Nov. 11-14, 2007, pp. 139-145, Austin, Texas, USA.

Dershowitz, N. et al., "A Scalable Algorithm for Minimal Unsatisfiable Core Extraction," *Proceedings of SAT 2006*, pp. 36-41, vol. 4121.

Ho, R. et al., "What can be expected from the Accellera Unified Coverage Interoperability Standard?," *Electronic Design Europe*, Oct. 22, 2010, seven pages. [Online] [Retrieved Jan. 13, 2014] Retrieved from the Internet <URL: http://electronicdesign.com/displays/what-can-be-expected-accellera-unified-coverage-interoperability-standard.>.

Hoskote, Y. et al., "Coverage Estimation for Symbolic Model Checking," *Proceedings of the 36th Annual ACM/IEEE Design Automation Conference (DAC '99)*, 1999, pp. 300-305.

Liu, C.-N. et al., "Efficient coverage analysis metric for HDL design validation," *Proceedings of IEE International Conference on Computers and Digital Techniques*, Jan. 2001, pp. 1-6, vol. 148, No. 1.

Piziali, A., "Functional Verification Coverage Measurement and Analysis," 2004, two hundred thirteen pages, Kluwer Academic Publishers, Massachusetts, USA.

Ranjan, R. et al., "Understanding coverage with multiple verification methods," *Jasper Design Automation, Nov. 28, 2007*, six pages, Tech Source Media, Inc. [Online] [Retrieved Jan. 7, 2014] Retrieved from the Internet <URL: http://jasper-da.com/sites/default/files/pdfs/Understanding_coverage_multiple_verification_methods_Nov2007.pdf.

Ranjan, R., "We need a simpler and faster approach to formal verification," *Jasper Design Automation, EE Times*, Jul. 30, 2012, four pages. [Online] [Retrieved Jan. 7, 2014] Retrieved from the Internet <URL: http://www.eetimes.com/author.asp?section_id=36&doc_id=1287752.>.

Springsoft, "Certitude Functional Qualification System," Apr. 3, 2012, three pages. [Online] [Retrieved Jan. 7, 2014] Retrieved from the Internet <URL: https://web.archive.org/web/20120403191715/http:/www.springsoft.com/products/functional-qualification/certitude.>.

Non-Final Office Action dated Jun. 19, 2014 for U.S. Appl. No. 14/073,787.

* cited by examiner

```
000  module shift(a, clk, rst);
001  input a, clk, rst;
002  reg [4:0] state;
003
004  wire w0 = state[0];
005  wire w1 = state[1];
006  wire w2 = state[2];
007  wire w3 = state[3];
008
009  always @(posedge clk)
010  begin
011     if (rst)
012        state <= 5'b00000;
013     else
014       begin
015          state[0] <= a;
016
017          state[1] <= w0;
018          state[2] <= w1;
019          state[3] <= w2 || w1;
020
021          state[4] <= w3;
022       end
023  end
024  endmodule
```

FIG. 1B

FORMAL VERIFICATION COVERAGE METRICS FOR CIRCUIT DESIGN PROPERTIES

BACKGROUND

1. Field of the Disclosure

This disclosure relates generally to formal verification of circuit designs, and more specifically to formal verification coverage metrics for formal verification of circuit designs.

2. Description of Related Art

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among them.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical design tools to create a HDL-based design.

In the design flow, creation of the RTL source code is followed by verification of the design to check if the RTL source code meets various design specifications. Formal verification is one such technique for verifying the circuit design. Formal verification uses mathematical techniques to prove that, under a set of constraints, a design property is either always correct or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid inputs for a given circuit and is akin to an exhaustive simulation.

The effectiveness of formal verification depends on the completeness of the property set that is used to verify the circuit design. The property set should be sufficient to provide test coverage for a large portion of the circuit design. The degree to which the circuit design is tested with the property set during formal verification is quantified with a coverage metric. A low coverage metric indicates that more properties are needed to properly test the circuit design, whereas a high coverage metric indicates that the current property set is sufficient. However, existing coverage metrics overestimate the coverage of a property set and mislead the circuit designer into believing that the current property set provides sufficient test coverage during formal verification when it actually does not.

SUMMARY

To improve the quality of formal verification coverage metrics for circuit designs, embodiments of the present disclosure leverage the idea of a proof core in generating coverage metrics. In one embodiment, a computer-implemented method for circuit design verification comprises performing formal verification on a circuit design to prove a correctness of a property of the circuit design. The circuit design has a cone of influence representing a portion of the circuit design capable of affecting signals of the property. A proof core of the circuit design is identified, the proof core being a portion of the cone of influence that is sufficient to prove the correctness of the property. A coverage metric is generated that is indicative of a level of formal verification coverage provided by the property based on the proof core of the circuit design.

The coverage metric generated using the disclosed method more accurately represents the true level of formal verification coverage associated with a property. The coverage metric can be generated using any one of a number of coverage models, such as with statement coverage models, branch coverage models, and expression coverage models. The property may also be presented on a display to a circuit designer for further review so that the circuit designer is aware of whether more properties are needed to sufficiently test the circuit design.

BRIEF DESCRIPTION OF THE DRAWINGS

The teachings of the embodiments of the present disclosure can be readily understood by considering the following detailed description in conjunction with the accompanying drawings.

FIG. 1B is a RTL description of the circuit design of FIG. 1A that can be verified during formal verification, according to an embodiment.

DETAILED DESCRIPTION OF THE PREFERRED EMBODIMENTS

The Figures (FIG.) and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present disclosure(s), examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the disclosure described herein.

Embodiments of the present disclosure describe a formal verification system that generates more accurate formal verification coverage metrics for a circuit design. The formal verification system performs formal verification on a property to prove a correctness of the property. The property can have a cone of influence in the circuit design. A proof core is identified, which is a portion of the cone of influence that is sufficient to prove a correctness of the property P. Using the proof core, a coverage metric is generated for the circuit design that represents an amount of formal verification coverage provided by the property.

Figure 1A:
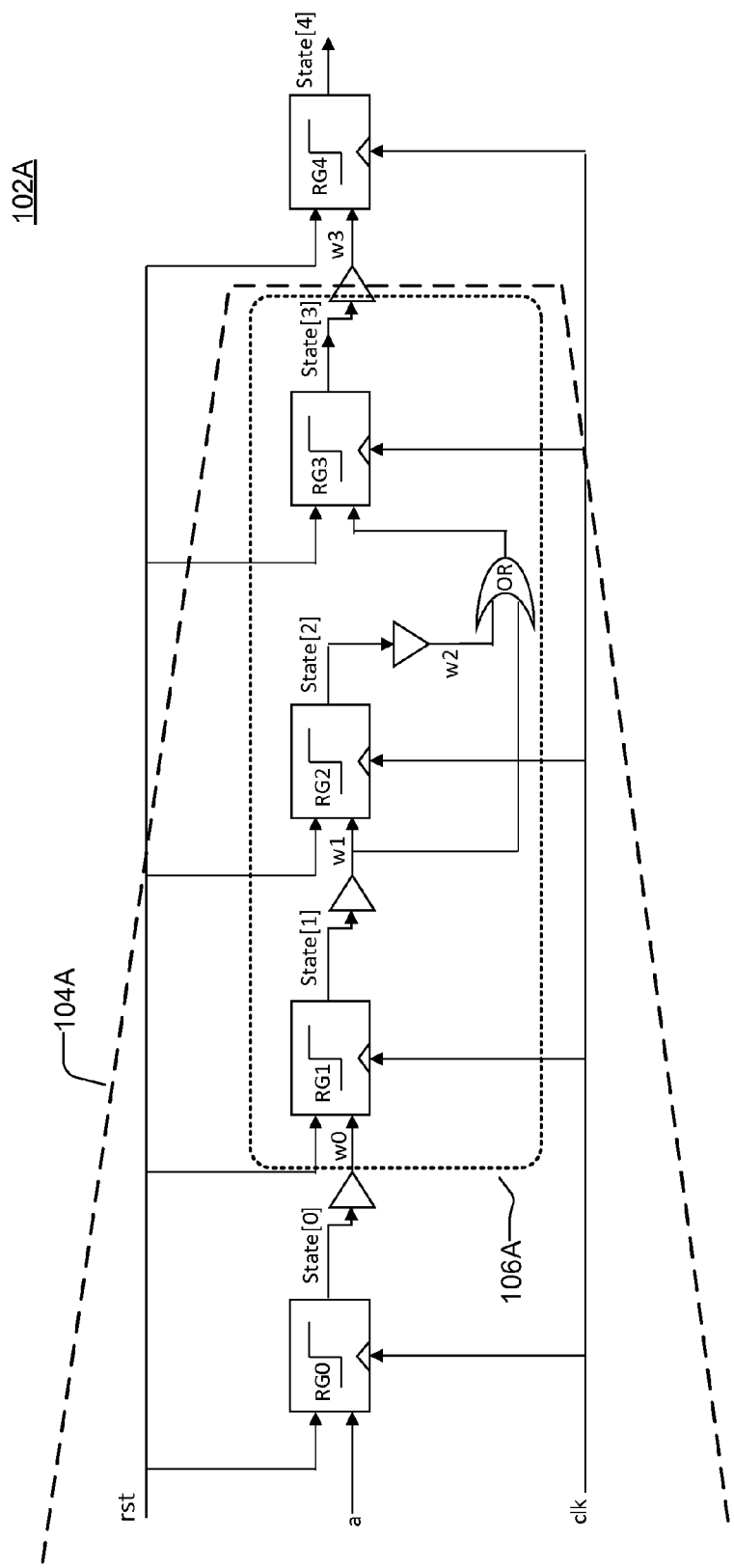
FIG. 1A is a gate level representation of a circuit design that can be verified during formal verification, according to an embodiment.

FIG. 1A is a gate level representation 102A of a circuit design that can be verified during formal verification, according to an embodiment. FIG. 1A is a simple example of a circuit design that is included for the purposes of illustration only. In other embodiments, the circuit design may have different logic elements than that shown in FIG. 1A. Additionally, the circuit design may have many more logic elements than that shown in FIG. 1A.

The circuit design of FIG. 1A is a shift-register that includes a chain of five registers RG[0:4]. There are also logic elements (buffers, OR gates) between the output of one register RG and the input of the next register RG that control the propagation of data from one register RG to the next. The circuit design includes three signal inputs: "rst", "a", and "clk". The "rst" signal is connected to a reset input of each register RG and resets all of the registers RG when asserted. The "clk" signal is connected to a clock input of each register RG and controls the timing of data propagation through the registers RG. The "a" signal includes input data that is to be shifted through the registers RG.

During formal verification, the circuit design is tested by attempting to prove the correctness of a property that has been written for the circuit design. A property is a specification or requirement that is to be satisfied by the circuit design and can describe a behavioral relationship between signals of the circuit design. An example of a property that can be verified during formal verification is the following property:

state[2]|=>state[3]   (Property P)

Property P includes two parameters: state[2] and state[3]. Property P means that when signal state[2] is logic 1 in a clock cycle, signal state[3] should also be logic 1 in the next immediate clock cycle.

Property P has a cone of influence (COI) 104A in the circuit design that includes portions of the circuit design capable of structurally affecting the signals of property P. As shown in FIG. 1A, the COI 104A includes registers RG[0:3], signals state[0:3], rst, a, clk and w[0:2], as well as most of the logic elements. The COI 104A of property P includes two registers RG2 and RG3 because these components directly generate the signals state[2] and state [3] that are specified by the property P. The COI 104A also includes components and signals in the fan-in of registers RG2 and RG3, such as the rst and clk signals. The fan-in of each component can be traced backwards to establish the full COI 104A of property P.

Portions of the circuit design that are not in the recursive fan-in of the signals of property P are not within the COI 104A. For example, register RG4 is not within the COI 104A. This is because register RG4 only generates the state [4] signal that serves as an output of the circuit design and cannot affect the value of the state[2] or state[3] signals.

Property P also has a proof core 106A in the circuit design. The proof core 106A is a portion of the COI 104A that is sufficient for proving the correctness of property P during formal verification. As shown in FIG. 1A, the proof core 106A for property P includes registers RG[1:3], signals state[1:3] and w[0:2], input signals clk and rst, as well as some logic elements. The circuitry and signals within the proof core 106A are sufficient for proving the correctness of property P. The circuitry and signals outside of the proof core 106A, such as register RG0 and signal state[0], are not needed for proving property P. This is because whenever the state[2] signal becomes a logic "1", only the circuit elements between the state[2] and state [3] signals (e.g. OR gate and buffer RG3) can affect whether the state[3] signal becomes logic "1" in the next clock cycle. By contrast, the status of the state[0] signal does not affect whether state[3] will change to logic "1" in the next clock cycle and can only affect whether the state[1] signal changes to logic "1" in the next clock cycle.

In one embodiment, proof core 106A is a portion of the COI 104A that is minimally sufficient for proving the property P. A minimally sufficient proof core 106A includes only portions or part of the circuit design that are both sufficient and necessary for proving a property P. For example, the proof core 106A shown in FIG. 1A is sufficient for proving the property P but is not minimally sufficient. A minimally sufficient proof core 106A would only include registers RG[2:3], signals state[2:3] and w2, input signals rst and clk, the OR gate, and the buffer between state[2] and w2. Signal w1 is not needed to prove the property P because the OR gate will always output a value of "1" when the state[2] signal is logic "1".

FIG. 1B is a RTL description 102B of the circuit design of FIG. 1A, according to an embodiment. The RTL description 102B includes several lines of code statements that describe the behavior of the circuit design. When synthesized, the RTL description 102B of FIG. 1B results in the gate level representation 102A of FIG. 1A.

Portions of the RTL description 102B can be traced to their equivalent circuitry from the gate level representation 102A. Statements 009-019 of the RTL description 102B result in the circuitry found inside the COI 104A of the gate level representation 102A. Statements 009-019 thus form the COI 104B at the RTL level. Statements 017-019 of the RTL description 102B result in the circuitry found inside the proof core 106A of the gate level representation 102A. Statements 017-019 thus form the proof core 106B at the RTL level. Note that the RTL level proof core 106B makes certain assumptions, such as assuming the circuit design is in a post-reset condition so that the rst signal can be ignored and also assuming that the registers will be triggered every cycle so that clk signal can be ignored. In other embodiments, the RTL level proof core 106B may include a different number of RTL statements. For the purposes of this description, COI 104 may used to refer to any representation of the COI at any level of abstraction, and the proof core 106 can refer to any representation of the proof core at any level of abstraction.

Embodiments of the present disclosure use the proof core 106 to generate a coverage metric that indicates a level of formal verification coverage provided by a property. For example, the coverage metric may be a ratio of code statements that are in the RTL proof core 106B to all of the code statements in the RTL description 102B. Conventional coverage metrics rely only on the COI 104 to measure coverage, which results in coverage metrics that over-estimate the amount of coverage provided by a property. By narrowing the COI 104 down to a proof core 106 and leveraging the proof core 106 in generating the coverage metric, the coverage metric of the present disclosure more accurately represents how much of the circuit design is actually being tested by a particular property P.

Figure 2:
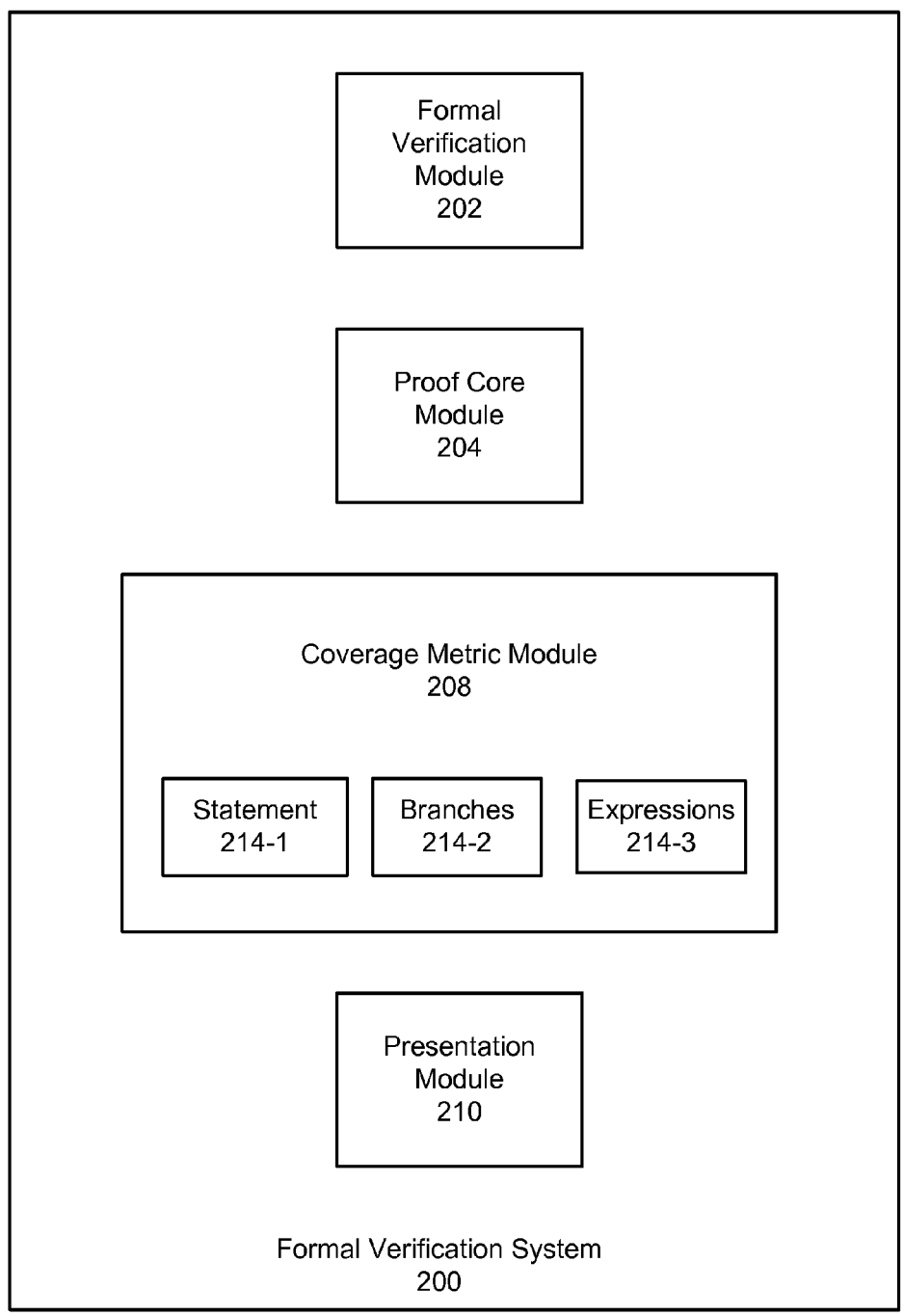
FIG. 2 is formal verification system for evaluating formal verification coverage of a circuit design, according to an embodiment.

FIG. 2 is formal verification system 200 for evaluating verification coverage of a circuit design, according to an embodiment. As shown, formal verification system 200 includes a formal verification module 202, a proof core module 204, a coverage metric module 208 and a presentation module 210. In one embodiment, the verification system 200 may be a computer and the modules are processor executable software instructions stored on a non-transitory computer readable medium of the computer.

Formal verification module 202 performs a formal verification of a circuit design using a set of properties and a set of signal constraints. Formal verification uses mathematical techniques to either prove that, under a set of constraints, each property in the set of properties is always correct or to provide an example condition (called a counterexample) that demonstrates the property is false. The counterexample can be a trace of signal inputs that cause the property to be false. In one embodiment, the formal verification module 202 is able to successfully prove that properties in the set of properties are always correct before providing the properties to the proof core module 204.

In one embodiment, the formal verification module 202 accesses a RTL description 102B of the circuit design, which may be written in HDL or other appropriate language. The formal verification module 202 converts the RTL description 102B into a format that is appropriate for formal verification. In one embodiment, the set of properties to be proven during formal verification may be embedded in the RTL description 102B or stored in a file that is separate from the RTL description 102B. The properties may also be assertions that are described in an assertion based verification language, such as System Verilog Assertion (SVA) or Property Specification Language (PSL).

The proof core module 204 identifies a proof core 106 for the set of properties verified as correct by the formal verification module 202. The proof core 106 is a portion of the COI 104A that is sufficient for proving the properties to be correct during formal verification. The computation of the proof core 106A also accounts for any signal constraints that were applied during formal verification.

In one embodiment, the proof core module 204 first identifies a gate level proof core 106A in the form of a gate level netlist that includes circuit elements and/or signals. The proof core module 204 then identifies a RTL level proof core 106B from the gate level proof core 106A. More specifically, the proof core 106 is computed using a satisfiability (SAT)-based model-checking algorithms using unsatisfiable core generation techniques. One example of such a technique is described in *A Scalable Algorithm for Minimal Unsatisfiable Core Extraction*, by Nachu, Dershowitz, Ziyad Hanna, and Alexander Nadel, 36-41 2006 SAT Conference, which is hereby incorporated by reference in its entirety.

Generally, a circuit design and property are synthesized into a gate level netlist and represented in conjunctive normal form (CNF). Proving the correctness of the property on a design is equivalent to proving that the CNF representation is not satisfiable (UNSAT), which means there do not exist assignments (or values) for the variables (e.g. flip flops and inputs) of the circuit design that makes the property false. It is known that if the CNF representation is UNSAT, there exists a subset of the formula (in CNF format) that is UNSAT too (in the worst case the subset is equal to the entire CNF). Such a subset can be called an UNSAT core, which is sufficient to prove that the property P is true. The proof core module 204 translates the property P and the circuit design into a gate level netlist, then to CNF. The proof core module 204 proves that the CNF is UNSAT, and then computes the UNSAT core.

The proof core module 204 then lifts the UNSAT core to the original circuit design by mapping the variables in the CNF representation to the gate level to identify the UNSAT core at the gate level, and then maps the gate level UNSAT core to RTL to identify the UNSAT core at the RTL. This is a book-keeping process that maintains the name correspondence between inputs and registers in the RTL description 102B to the gate level representation 102A and the CNF variables. The resulted structure of the UNSAT core at the gate level becomes the gate level proof core 106A and the UNSAT core at the RTL description level becomes the RTL description proof core 106B.

The coverage metric module 208 generates a coverage metric that indicates a level of formal verification coverage provided by the set of properties that were tested during formal verification. A variety of different coverage models 214 can be used in generating the coverage metric. A coverage model 214 is a set of cover items, where each cover item represents an implicit or explicit event in the circuit design that is to be covered by the circuit design. For a given coverage model 214, an intersection between the cover items in the coverage model 214 and the RTL statements in the RTL proof core 106B is first determined in order to identify those cover items that are within the RTL proof core 106B. The coverage is then be computed as a percentage of the cover items that are found within the RTL proof core 106B relative to all of the cover items in the coverage model. For example, the coverage metric can be computed to be "40% coverage." Higher coverage metrics indicate a better level of coverage, whereas lower coverage metrics indicate a lower level of coverage. The coverage can also be computed in other ways that represent a relationship between the subset of cover items that are covered by the RTL proof core 106B and all of the cover items. For example, the coverage metric can be a ratio of "4/10 cover items met."

Three different types of coverage models 214 are shown in FIG. 2: a statement coverage model 214-1, a branch coverage model 214-2, and an expression coverage model 214-3. In other embodiments, other coverage models are also possible even though not shown in FIG. 2. The coverage metric module 208 can select from any of the coverage models 214 when generating the coverage metrics.

Statement coverage model 214-1 can include cover items in the form of one or more of the code statements in the RTL representation 102B of the circuit design. When statement coverage model 214-1 is used, the coverage metric module 208 generates a statement coverage metric that represents a level of statement coverage provided by the RTL proof core 106B. Different variations of statement coverage models 214-1 are possible. Some statement coverage models 214-1 only include assignment statements from the RTL representation 102B. Referring to FIG. 1B, assignment statements are found in lines 012, 015, 017, 018, 019, and 021 for a total of six assignment statements. An assignment coverage metric generated for the proof core 106B would thus be "3/6" assignment statements covered. Other statement coverage models 214-1 may include all of the statements in the RTL representation 102B. Branch coverage model 214-2 can include all of the branches in the RTL description 102B of the circuit design. When branch coverage model 214-2 is used, the coverage metric module 208 generates a branch coverage metric that represents a level of branch coverage provided by the RTL proof core 106B. For example, the branch coverage metric can be a percentage of code branches found within the RTL proof core 106B relative to all code branches within the RTL description 102B.

Expression coverage model 214-3 can include expression cover items for logic expressions and sub-expressions in the RTL description 102B of the circuit design. Expression coverage model 214-3 can be used to identify logic expressions and sub-expressions in the design and to create expression cover items for each expression. For example if the expression of the form A&B, then there are three cover items: A, B, and A&B. The cover items are then used to generate an expression coverage metric that represents a level of expression coverage provided by the RTL level proof core 106B. For example, the branch coverage metric can be a percentage of the expression cover items found within the RTL level proof core 106B.

Statement model puts all statements in coverage model. They cover statements in COI to all statements. We identifying list of cover items within the proof core.

The presentation module 210 presents the coverage metric in a display so that the coverage metric can be viewed by a circuit designer. The circuit designer can then evaluate whether the amount of coverage provided by the tested properties is sufficient. If the coverage is not sufficient, the circuit designer may add additional properties to increase the level of coverage and then re-run the verification process to update the coverage metric.

Figure 3:
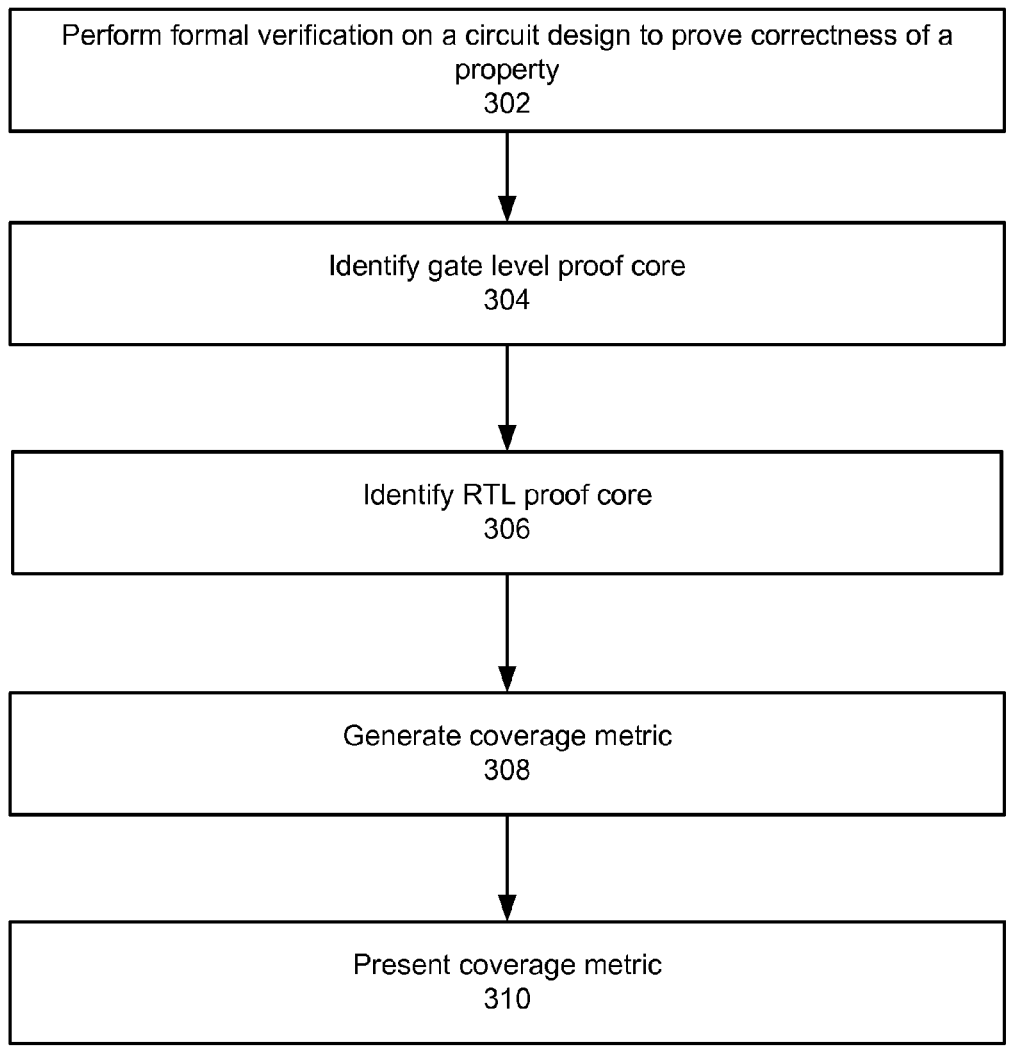
FIG. 3 is a method for evaluating formal verification coverage of a circuit design, according to an embodiment.

FIG. 3 is a method for evaluating formal verification coverage of a circuit design, according to an embodiment. In one embodiment, the method of FIG. 3 is performed by the modules of FIG. 2.

In step 302, a formal verification is performed on a circuit design to prove a correctness of a property of the circuit design. The circuit design has a COI 104 that represents a portion of the circuit design capable of affecting signals of the property. In step 304, a gate level proof core 106A is identified. In step 306, a RTL level proof core 106B is identified from the gate level proof core 106A. Both proof cores 106A and 106B are a portion of the COI 104 that is sufficient to prove the correctness of the property P during formal verification.

In step 308, a coverage metric is generated that is indicative of a level of formal verification coverage provided by the property. This coverage metric is generated from the RTL level proof core 106B. Different coverage models, such as statement coverage model 214-1, branch coverage model 214-2, and expression coverage model 214-3, can be selected for generating the coverage metric that result in different types of coverage metrics. In step 310, the coverage metric 310 is presented in a display, which can then be viewed by a circuit designer to determine whether the level of formal verification coverage is sufficient or whether more properties are needed.

The foregoing description of the embodiments of the disclosure has been presented for the purpose of illustration; it is not intended to be exhaustive or to limit the embodiments to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a non-transitory computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

We claim:

1. A computer-implemented method for circuit design verification, comprising:
    performing formal verification on a circuit design to prove a correctness of at least one property of the circuit design, the circuit design having a cone of influence representing a portion of the circuit design capable of affecting signals of the at least one property;
    identifying a proof core of the circuit design, the proof core being a portion of the cone of influence that is sufficient to prove the correctness of the at least one property;
    identifying, from a plurality of cover items, one or more cover items corresponding to the proof core; and
    generating, by a computer, a coverage metric that is indicative of a level of formal verification coverage provided by the at least one property during the formal verification based on a relationship between the one or more cover items corresponding to the proof core and the plurality of cover items, a lower coverage metric indicating that more properties are needed for sufficient verification coverage, and a higher coverage metric indicating that the at least one property provides sufficient verification coverage.

2. The computer-implemented method of claim 1, wherein identifying the proof core of the circuit design comprises:
    identifying a gate level proof core of the circuit design, the gate level proof core being a portion of the cone of influence specified at a gate level that is sufficient to prove the correctness of the at least one property; and identifying a register transfer level (RTL) proof core of the circuit design that corresponds to the gate level proof core,
wherein the coverage metric is generated based on the RTL proof core of the circuit design.

3. The computer-implemented method of claim 1, wherein the proof core of the circuit design is at register transfer level (RTL).

4. The computer-implemented method of claim 3, wherein generating the coverage metric comprises:
generating a statement coverage metric indicative of a level of RTL code statement coverage provided by the at least one property.

5. The computer-implemented method of claim 3, wherein generating the coverage metric comprises:
generating a branch coverage metric indicative of a level of RTL branch coverage provided by the at least one property.

6. The computer-implemented method of claim 3, wherein generating the coverage metric comprises:
generating an expression coverage metric indicative of a level of expression coverage provided by the at least one property.

7. The computer-implemented method of claim 1, further comprising:
presenting the coverage metric in a display.

8. The computer-implemented method of claim 1, wherein the proof core of the circuit design is both sufficient and necessary to prove the correctness of the at least one property.

9. A non-transitory computer readable medium storing processor executable instructions for circuit design verification, the instructions comprising instructions for:
performing formal verification on a circuit design to prove a correctness of at least one property of the circuit design, the circuit design having a cone of influence representing a portion of the circuit design capable of affecting signals of the at least one property;
identifying a proof core of the circuit design, the proof core being a portion of the cone of influence that is sufficient to prove the correctness of the at least one property;
identifying, from a plurality of cover items, one or more cover items corresponding to the proof core; and
generating a coverage metric that is indicative of a level of formal verification coverage provided by the at least one property during the formal verification based on a relationship between the one or more cover items corresponding to the proof core and the plurality of cover items, a lower coverage metric indicating that more properties are needed for sufficient verification coverage, and a higher coverage metric indicating that the at least one property provides sufficient verification coverage.

10. The computer readable medium of claim 9, wherein identifying the proof core of the circuit design comprises:
identifying a gate level proof core of the circuit design, the gate level proof core being a portion of the cone of influence specified at a gate level that is sufficient to prove the correctness of the at least one property; and
identifying a register transfer level (RTL) proof core of the circuit design that corresponds to the gate level proof core,
wherein the coverage metric is generated based on the RTL proof core of the circuit design.

11. The computer readable medium of claim 9, wherein the proof core of the circuit design is at register transfer level (RTL).

12. The computer readable medium of claim 11, wherein generating the coverage metric comprises:
generating a statement coverage metric indicative of a level of RTL code statement coverage provided by the at least one property.

13. The computer readable medium of claim 11, wherein generating the coverage metric comprises:
generating a branch coverage metric indicative of a level of RTL branch coverage provided by the at least one property.

14. The computer readable medium of claim 11, wherein generating the coverage metric comprises:
generating an expression coverage metric indicative of a level of expression coverage provided by the at least one property.

15. The computer readable medium of claim 9, further comprising:
presenting the coverage metric in a display.

16. The computer readable medium of claim 9, wherein the proof core of the circuit design is both sufficient and necessary to prove the correctness of the at least one property.

17. The computer-implemented method of claim 1, wherein:
the formal verification is performed on at least a portion of the circuit design to prove the correctness of the at least one property, and
the proof core of the circuit design is a portion of the cone of influence that is smaller than the portion of the circuit design on which formal verification is performed.

18. The computer readable medium of claim 9, wherein:
the formal verification is performed on at least a portion of the circuit design to prove the correctness of the property, and
the proof core of the circuit design is a portion of the cone of influence that is smaller than the portion of the circuit design on which formal verification is performed.

* * * * *